Aug. 20, 1963 J. P. BURGARELLA ETAL 3,101,451
DIRECT CURRENT AMPLIFIER SYSTEM WITH FEEDBACK CONTROLLED HIGH IMPEDANCE INPUT CIRCUIT
Filed Oct. 17, 1958
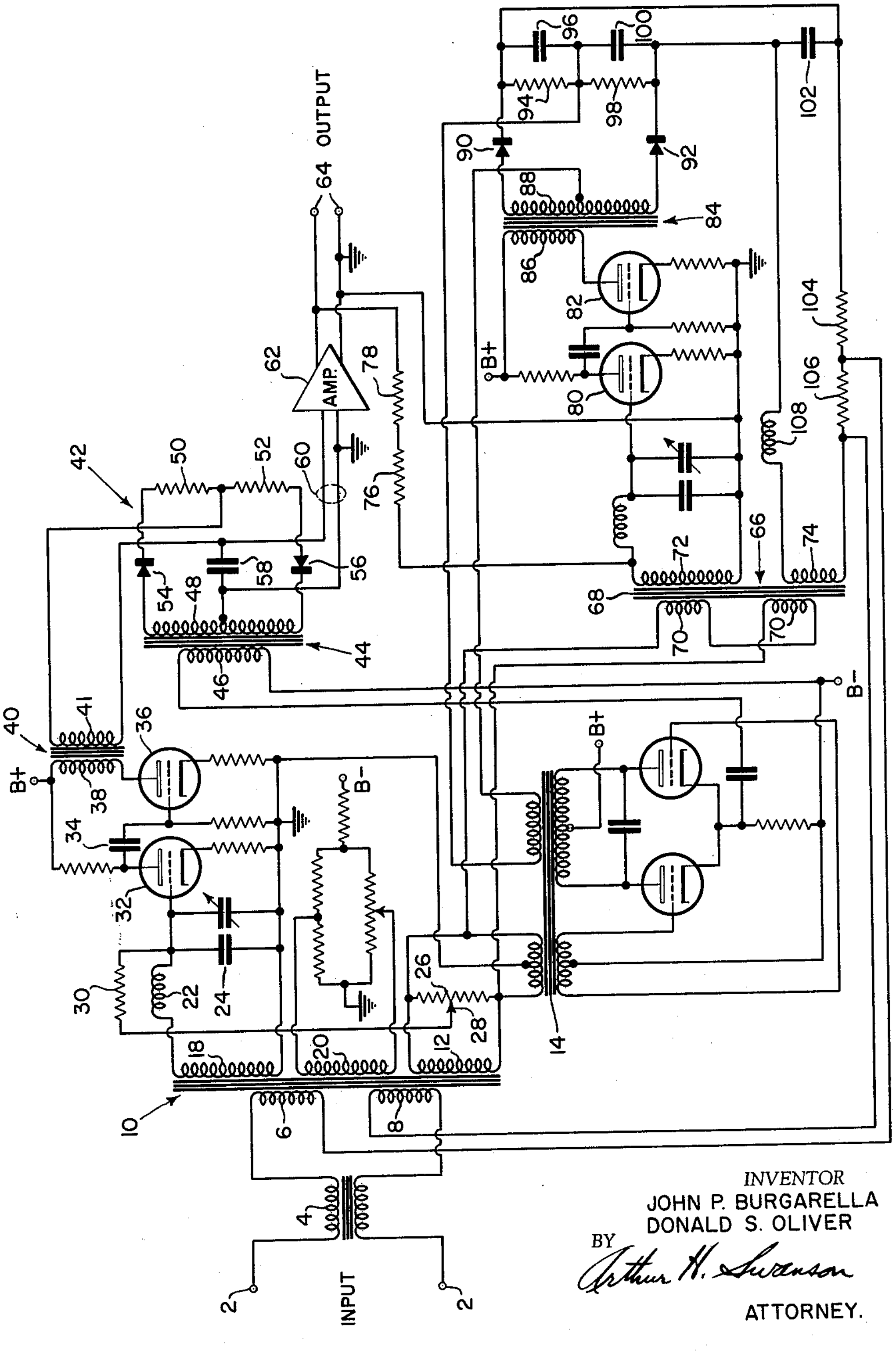
INVENTOR
JOHN P. BURGARELLA
DONALD S. OLIVER
BY *Arthur H. Swanson*
ATTORNEY.

United States Patent Office 3,101,451

Patented Aug. 20, 1963

3,101,451

DIRECT CURRENT AMPLIFIER SYSTEM WITH FEEDBACK CONTROLLED HIGH IMPEDANCE INPUT CIRCUIT

John P. Burgarella, Sudbury, and Donald S. Oliver, Acton, Mass., assignors to Minneapolis-Honeywell Regulator Company, Minneapolis, Minn., a corporation of Delaware Filed Oct. 17, 1958, Ser. No. 767,987

6 Claims. (Cl. 330—10)

This invention relates to electronic apparatus, and more particularly to electronic amplifier circuits.

Heretofore, there have been provided direct current amplifiers which feature means for overcoming inherent errors due to a drifting in the characteristics of circuit elements. One method of obviating the direct current drift error is the conversion of the input signal to a corresponding alternating signal, passing that signal through an alternating current amplifier, which is inherently free from the drift error, and reconverting the amplified alternating signal to a unidirectional signal. In recent developments it has become increasingly important that amplifiers be provided which feature means whereby the input terminals of the amplifier are electrically isolated from ground. Such an amplifier may, for example, be used in controlling on the voltage difference between two voltage input signals without reference to the relative magnitude of each of the two signals with respect to ground.

Again, such an amplifier may be used in the measurement of or control from minute voltage signals while avoiding the introduction of errors in the output signal due to differences occurring between the ground level of the amplifier and that of the signal source.

It is, accordingly, an object of the present invention to provide an improved direct current amplifier which features means for isolating the input terminals from the amplifier ground.

It is another object of this invention to provide an improved direct current amplifier, as set forth, which features the isolation of the input terminals and which is highly stable and accurate in operation.

In many applications for use for such amplifiers, it is essential that the amplifier present a relative high impedance to incoming signals. One example of such an application is the case where the amplifier is to be supplied with signals from a high impedance transducer of a sensitive measuring instrument. If the input impedance of the amplifier is low relative to the output impedance of the transducer, the transducer will be loaded by the amplifier and an erroneous signal result.

It is therefore a further object of the present invention to provide an improved direct current amplifier which features the isolation of the input terminals and which is characterized by having a high input impedance.

A still further object of the present invention is to provide an improved direct current amplifier as set forth wherein the high input impedance is obtained by means of feedback from grounded output terminals to the input circuit while maintaining the input circuit conductively isolated from ground.

In accomplishing these and other objects, there has been provided, in accordance with the present invention, a direct current amplifier of the type wherein an input signal is applied as the modulating signal to an even harmonic magnetic modulator or converter, preferably the second-harmonic of the exciting signal is used. Here, the input signal is converted to an alternating signal of twice the frequency of an exciting signal, modulated in accordance with the input signal. The alternating signal is amplified and demodulated by a synchronous demodulator to produce a direct current output signal. A portion of the output signal is applied as an input signal to a second magnetic modulator or converter. Here, the portion of the output signal is again converted to a second-harmonic signal which is amplified and then demodulated. The demodulated output of the second demodulator is fed back to the second convertor to stabilize the second amplifier, and to the first converter in opposition to the original input signal. The second-modulator-amplifier circuit effects the isolation, conductively, of the output circuit from the input terminals while permitting the used feedback to effect an increase in the apparent input impedance.

A better understanding of this invention may be had from the following detailed description when read in connection with the accompanying drawing, in which the single FIGURE is a schematic diagram of a circuit embodying the present invention.

Referring now to the drawing in more detail, there is shown a pair of input terminals 2. A balanced input choke 4 is connected to these input terminals for the purpose of preventing a low impedance signal source from effectively short-circuiting the subsequent modulator. From the two coils of the choke 4, connection is made to the extreme ends of a pair of input windings 6 and 8 of a second-harmonic magnetic modulator or converter 10. The magnetic modulator 10 includes a magnetic core structure having thereon an exciting winding, an input winding, or as in this case a pair of input windings, an output winding, and a zeroing winding. In the illustrated structure, the exciting winding 12 is coupled, through a coupling transformer 14 to the output of a driving oscillator 16. The modulator is so arranged that when the flux in the core structure resulting from the exciting winding is balanced, no output signal is produced in the output winding 18. In order to assure this relationship, notwithstanding certain magnetic asymmetries associated with the exciting winding or resulting from associated circuitry, there is provided a zeroing winding 20. This winding is connected across an adjustable resistance bridge arrangement, whereby a small amount of direct current energy may be applied to the zeroing winding to compensate for the aforementioned asymmetries.

On the other hand, when the magnetic flux in the core structure is unbalanced, as by the application of a signal from the input terminals to the input windings 6 and 8, there is produced in the output winding an output signal of a frequency which is the second-harmonic of the frequency of the exciting signal applied to the exciting winding, and of an amplitude which is proportional to the amount of unbalanced produced in the core structure. A filter comprising a coil 22 and a capacitor 24 is connected across the output winding, tuned to resonance at the second-harmonic frequency, to eliminate from the output circuit components of the fundamental frequency of the oscillator 16. A slidewire resistor 26, connected across the exciting winding 12, permits the injection into the output circuit, through the adjustable tap 28 and series resistor 30, of a small amount of the fundamental frequency from the oscillator to be applied in opposition to any ripple of fundamental frequency that may have been passed through the filter.

The filtered signal is applied to a two stage alternating current amplifier which includes a first stage amplifier tube 32, a coupling capacitor 34, and a second stage amplifier tube 36. The output of the second amplifier stage tube is applied to the primary winding 38 of a coupling transformer 40. The secondary winding 41 of the coupling transformer 40 is connected to the input of a phase-sensitive synchronous diode demodulator 42. The demodulator 42 includes a transformer 44 having a primary winding 46 excited from a second-harmonic component of the energy from the oscillator 16. The transformer 44 has a center-tapped secondary winding 48 which is connected in a balanced bridge arrangement with a pair of resistors 50 and 52. A pair of oppositely poled diodes 54 and 56 are connected, respectively, in series with the extreme terminals of the secondary winding 48 and to corresponding ends of the resistors 50 and 52. One lead from the output coupling transformer 40 is connected to the common point between the two resistors 50 and 52 and the other lead, from the coupling transformer 40, is connected to one terminal of a smoothing capacitor 58, the other terminal of which is connected to the center-tap of the secondary winding 48. A pair of output leads 60 from the demodulator 42 are connected across the smoothing capacitor 58 and connected to the input terminals of a direct coupled amplifier 62. The output of the amplifier 62 is, then, the controlled output signal of the system and is accordingly connected to the system output terminals 64.

Connected in parallel with the output terminals 64 is an isolating feedback amplifier network. This amplifier network includes a second magnetic modulator or converter 66. The second converter also includes a core structure 68 having a pair of exciting windings 70 wound thereon, as well as an output winding 72 and a feedback winding 74. The exciting windings 70 are also coupled, through the coupling transformer 14, to the driving oscillator 16. As before, so long as the fluxes in the core structure resulting from the exciting windings, balance, there will be no resulting signal in the output winding. In the instant case, instead of providing a separate input winding for the converter 66, a control signal is injected directly into the output winding 72 through the resistors 76 and 78, from the output of the amplifier 62. This arrangement produces an unbalance in the exciting flux in the core structure 68 and results in a second-harmonic signal being introduced into the output winding 72 of an amplitude which is proportional to the magnitude of the input signal applied from the output of the amplifier 62.

This second-harmonic frequency signal is amplified in a two-stage alternating current amplifier which includes a first amplification stage tube 80 and a second amplification tube 82. The output of the second-stage tube 82 is fed to a synchronous demodulator which includes a demodulator transformer 84 having a primary winding 86 and a center-tapped secondary winding 88. The output of the second amplification stage tube 82 is directly connected to the primary winding 86 of the transformer 84. The extreme ends of the secondary winding 88 are connected, respectively, to a pair of similary poled diode rectifiers 90 and 92. The output terminal of the rectifier 90 is connected to a parallel arrangement of a resistor 94 and a capacitor 96. Similarly, the output terminal of the diode 92 is connected to the parallel arrangement of a resistor 98 and a capacitor 100. The ends of the resistors 94 and 98 remote from the connection to their respective diodes are connected to a common point. Similarly, the capacitors 96 and 100 are connected to the same common point as the resistors 94 and 98. The reference alternating signal from the oscillator 16 is applied between this common point and the center tap of the secondary winding 88 of the transformer 84.

In the absence of a signal applied to the primary winding 86 of the transformer 84, the excitation from the oscillator 16 will be balanced across the two diodes 90 and 92 and the resistors 94 and 98 and capacitors 96 and 100. The application of a signal of one phase or the opposite phase to the primary winding 86 of the transformer 84 produces an unbalance in the signals appearing at the two remote ends of the secondary winding 88. The unbalance is rectified to produce a direct current signal of one polarity or the other depending upon the phase of the signal applied to the primary winding 86. The direct current signal thus produced is applied across a filter capacitor 102 through a pair of load resistors 104 and 106 to the feedback winding 74 of the second magnetic converter 66. A choke 108 in the feedback loop operates in a manner similar to the choke 4 in preventing the effective short-circuiting of the converter 66.

It will be recalled that the input signal was applied through a balanced choke 4 to the extreme ends of a pair of input windings 6 and 8 of the initial second-harmonic converter 10. The two inner ends of these windings 6 and 8 are connected together through the resistor 106 in the feedback loop of the isloating amplifier. With this arrangement, the portion of the signal which is developed across the resistor 106 is fed back to the initial input circuit in opposition to the input signal, i.e. inverse feedback. Since the amplification system involves appreciable gain, the feeding back of a substantial part of the output signal, then, effectively multiplies the input impedance by a factor on the order of magnitude of that portion of the gain of the system represented by the signal fed back to the input circuit. If, for example, that portion of the signal which is developed across the resistor 106 is of a magnitude, say 99% of the original input signal, then, when that portion of the signal is fed back in opposition to the input signal, the apparent input impedance is increased by a factor of 100.

It may be seen that, although there is a conductive connection between the input circuit and the output of the feedback amplifier network, there are at the same time, no conductive paths between the input circuit and any point of the circuit structure which is connected directly to ground. This is true notwithstanding the fact that the system output, that is, one of the output terminals 64 of the amplifier 62 is grounded. The input circuit is conductively isolated from the main amplifier by the converter 10. Here, the only coupling between the input circuit and the amplifier, which is referenced to ground, is an inductive coupling. The output of the power amplifier 62, which is referred to ground, is directly coupled into the feedback amplifier which is also referenced to ground. However, the output of the feedback amplifier is coupled only inductively to its demodulator. The demodulator is, itself free from any ground connection, its excitation being inductively derived from the oscillator transformer 14. In extension of the isolation of the demodulator from ground, it may also be seen that the feedback to the second converter is coupled inductively only. In this manner, means are provided for deriving a high level feedback signal directly from the direct current output of the circuit and applying the derived signal as negative feedback to the input circuit, while maintaining the input circuit free from conductive connection to ground.

What is claimed is:

1. A direct current amplifier system comprising, in combination, an input circuit, a magnetic converter, an alternating current amplifier, said input circuit being coupled inductively only through said converter to said alternating current amplifier, a synchronous demodulator coupled to demodulate the output of said alternating current amplifier to produce a system output signal, a feedback circuit responsive to said output signal, said feedback circuit including a second-magnetic converter, a second alternating current amplifier and a second synchronous demodulator, said second synchronous demodulator being coupled inductively only to the output of said second alternating current amplifier, and means connecting the output of said second demodulator in feedback relation to said input circuit whereby to provide a feedback controlled high impedance input circuit without conductive coupling between said input circuit and the output of the direct current amplifier.

2. A direct current amplifier system comprising, in combination, an input circuit, a magnetic converter of the second harmonic output type having an input winding and an output winding, said input winding being connected to said input circuit, an alternating current amplifier connected to said output winding, a synchronous demodulator coupled to demodulate the output of said alternating current amplifier, an output circuit connected to said demodulator to produce a system output signal, a feedback circuit connected to said output circuit, said feedback circuit including a second converter, a second alternating current amplifier and a second synchronous demodulator, said second demodulator being coupled inductively only to the output of said second alternating current amplifier, and means connecting the output of said second demodulator in feedback relation to said said input circuit whereby to provide a feedback controlled high impedance between said input circuit and said output circuit.

3. A direct current amplifier system comprising, in combination, an input circuit, a magnetic converter of the second harmonic output type having an input winding, an output winding, and an exciting winding, said input circuit being connected to said input winding, an oscillator connected to said exciting winding, an alternating current amplifier connected to said output winding, a synchronous demodulator coupled to demodulate the output of said alternating current amplifier, an output circuit connected to said demodulator to produce a system output signal, a feedback circuit connected to said output circuit, said feedback circuit including a second magnetic converter, a second alternating current amplifier and a second synchronous demodulator, said second demodulator being coupled inductively only to the output of said second alternating current amplifier, and means connecting the output of said second demodulator to inverse feedback relation to said input circuit whereby to provide a feedback controlled high impedance input circuit without conductive coupling between said input circuit and said output circuit.

4. A direct current amplifier system comprising, in combination, an input circuit, a magnetic converter of the second-harmonic output type having an input winding, an output winding, and an exciting winding, said input circuit being connected to said input winding, an oscillator connected to said exciting winding, an alternating current amplifier connected to said output winding, a phase-sensitive synchronous demodulator coupled to demodulate the output of said alternating current amplifier, an output circuit including a direct coupled power amplifier connected to said demodulator to produce a system output signal, a feedback circuit responsive to said output signal connected to said output circuit, said feedback circuit including a second magnetic converter, a second alternating current amplifier, and a second synchronous demodulator, said second demodulator being coupled inductively only to the output of said second alternating current amplifier, and means connecting the output of said second demodulator in inverse feedback relation to said input circuit whereby to provide a feedback controlled high impedance input circuit without conductive coupling between said input circuit and said output circuit.

5. A direct current amplifier system comprising, in combination, an input circuit, a magnetic converter of the sound-harmonic output type having an input winding, an output winding, and an exciting winding, said input circuit being connected to said input winding, an oscillator connected to said exciting winding, an alternating current amplifier connected to said output winding, said output winding being coupled inductively only to said output winding, a phase-sensitive synchronous diode demodulator coupled to demodulate the output of said alternating current amplifier, an output circuit including a direct coupled power amplifier connected to said demodulator to produce a system output signal, a feedback circuit responsive to said output signals connected to said output circuit, said feedback circuit including a second magnetic converter of the second-harmonic output type, a second alternating current amplifier, and a second phase-sensitive synchronous diode demodulator, said second demodulator being coupled inductively only to the output of said second alternating current amplifier, and means connecting the output of said second demodulator in inverse feedback relation to said input circuit whereby to provide a feedback controlled high impedance input circuit without conductive coupling between said input circuit and said output circuit.

6. A direct current amplifier system comprising, in combination, an input circuit, means for converting direct current input signals into alternating current signals, an alternating current amplifier, said input circuit being coupled inductively only through said converting means to said alternating current amplifier, a synchronous demodulator coupled to demodulate the output of said alternating current amplifier to produce a system output signal, a feedback circuit responsive to said output signal, said feedback circuit including a magnetic converter, a second alternating current amplifier and a second synchronous demodulator, said second synchronous demodulator being coupled inductively only to the output of said second alternating current amplifier, and means connecting the output of said second demodulator in feedback relation to said input circuit whereby to provide a feedback controlled high impedance input circuit without conductive coupling between said input circuit and the output of the direct current amplifier system.

References Cited in the file of this patent

UNITED STATES PATENTS

| | | |
|---|---|---|
| 2,164,383 | Burton | July 4, 1939 |
| 2,297,543 | Eberhardt et al. | Sept. 29, 1942 |
| 2,383,984 | Oberweiser | Sept. 4, 1945 |
| 2,444,726 | Bussey | July 6, 1948 |
| 2,728,858 | Ziffer | Dec. 27, 1955 |
| 2,901,563 | McAdam et al. | Aug. 25, 1959 |
| 2,932,799 | Rote et al. | Apr. 12, 1960 |

OTHER REFERENCES

Honeywell (advertisement), Control Engineering, September 1958 (published Aug. 29, 1958), page 84.